(12) United States Patent
Chen et al.

(10) Patent No.: US 8,981,502 B2
(45) Date of Patent: Mar. 17, 2015

(54) FABRICATING A MAGNETIC TUNNEL JUNCTION STORAGE ELEMENT

(75) Inventors: Wei-Chuan Chen, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 58 days.

(21) Appl. No.: 12/748,750

(22) Filed: Mar. 29, 2010

(65) Prior Publication Data

US 2011/0235217 A1 Sep. 29, 2011

(51) Int. Cl.
*H01L 27/22* (2006.01)
*H01L 43/08* (2006.01)
*H01L 43/12* (2006.01)

(52) U.S. Cl.
CPC .............. *H01L 43/08* (2013.01); *H01L 43/12* (2013.01); *H01L 27/228* (2013.01)
USPC ........... 257/421; 257/422; 257/247; 257/295; 257/E21.665

(58) Field of Classification Search
USPC .................................. 257/421, 422, 427, 295
See application file for complete search history.

(56) References Cited

U.S. PATENT DOCUMENTS

| | | | | |
|---|---|---|---|---|
| 7,148,072 B2* | 12/2006 | Fontana et al. | .................... | 438/3 |
| 7,531,367 B2* | 5/2009 | Assefa et al. | ....................... | 438/3 |
| 7,599,154 B2* | 10/2009 | Sbiaa et al. | ............... | 360/324.11 |
| 7,645,618 B2* | 1/2010 | Ditizio | ............................... | 438/3 |
| 7,645,718 B2 | 1/2010 | Li et al. | | |
| 7,944,738 B2* | 5/2011 | Liu et al. | ........................ | 365/158 |
| 7,957,182 B2* | 6/2011 | Liu et al. | ........................ | 365/171 |
| 7,989,224 B2* | 8/2011 | Gaidis | ................................ | 438/3 |
| 8,004,881 B2* | 8/2011 | Zhu et al. | ........................ | 365/158 |
| 2004/0127054 A1 | 7/2004 | Lee et al. | | |
| 2007/0002503 A1* | 1/2007 | Sbiaa et al. | ............... | 360/324.11 |
| 2007/0019341 A1* | 1/2007 | Mizuno et al. | ........... | 360/324.11 |
| 2007/0242395 A1* | 10/2007 | Bailey | ........................ | 360/324.2 |
| 2008/0037184 A1* | 2/2008 | Uesugi et al. | ............ | 360/324.11 |
| 2008/0043379 A1* | 2/2008 | Kanakasabapathy et al. | ......................... | 360/324.2 |
| 2008/0211055 A1* | 9/2008 | Assefa et al. | ................ | 257/506 |
| 2009/0103354 A1* | 4/2009 | Yoon et al. | .................... | 365/158 |

(Continued)

FOREIGN PATENT DOCUMENTS

EP 1463110 A2 9/2004
JP 2004214600 A 7/2004

(Continued)

OTHER PUBLICATIONS

International Search Report and Written Opinion—PCT/US2011/030008—ISA/EPO—Jun. 7, 2011.

*Primary Examiner* — Savitr Mulpuri
(74) *Attorney, Agent, or Firm* — Sam Talpalatsky; Nicholas J. Pauley; Joseph Agusta

(57) ABSTRACT

Methods for forming a magnetic tunnel junction (MTJ) storage element and MTJ storage elements formed are disclosed. The MTJ storage element includes a MTJ stack having a pinned layer stack, a barrier layer and a free layer. An adjusting layer is formed on the free layer, such that the free layer is protected from process related damages. A top electrode is formed on the adjusting layer and the adjusting layer and the free layer are etched utilizing the top electrode as a mask. A spacer layer is then formed, encapsulating the top electrode, the adjusting layer and the free layer. The spacer layer and the remaining portions of the MTJ stack are etched. A protective covering layer is deposited over the spacer layer and the MTJ stack.

14 Claims, 8 Drawing Sheets

(56) References Cited

U.S. PATENT DOCUMENTS

| | | | |
|---|---|---|---|
| 2009/0141543 A1* | 6/2009 | Ho et al. | 365/158 |
| 2009/0256220 A1 | 10/2009 | Horng et al. | |
| 2010/0178714 A1* | 7/2010 | Cho et al. | 438/3 |
| 2010/0207119 A1 | 8/2010 | Sakata et al. | |
| 2010/0207219 A1* | 8/2010 | Jin et al. | 257/421 |
| 2011/0133298 A1* | 6/2011 | Chen et al. | 257/421 |
| 2011/0141796 A1* | 6/2011 | Lee et al. | 365/158 |
| 2011/0169112 A1* | 7/2011 | Chen et al. | 257/421 |
| 2011/0194341 A1* | 8/2011 | Gaidis et al. | 365/171 |
| 2011/0204459 A1* | 8/2011 | Gaidis | 257/421 |

FOREIGN PATENT DOCUMENTS

| | | |
|---|---|---|
| JP | 2004349671 A | 12/2004 |
| JP | 2008181971 A | 8/2008 |
| JP | 2009253303 A | 10/2009 |
| JP | 2012508471 A | 4/2012 |
| KR | 20040060313 A | 7/2004 |
| WO | WO2009126201 A1 | 10/2009 |

* cited by examiner

FABRICATING A MAGNETIC TUNNEL JUNCTION STORAGE ELEMENT

FIELD OF DISCLOSURE

Disclosed embodiments are related to a Magnetic Tunnel Junction (MTJ) storage element usable in a Spin Transfer Torque Magnetoresistive Random Access Memory (STT-MRAM) cell, and to methods of fabricating the same.

BACKGROUND

Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

FIG. 1 illustrates a conventional STT-MRAM bit cell 100. The STT-MRAM bit cell 100 includes magnetic tunnel junction (MTJ) storage element 105, a transistor 101, a bit line 102 and a word line 103. The MTJ storage element is formed, for example, from at least two ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned or opposite. The resistance of the electrical path through the MTJ will vary depending on the alignment of the polarizations of the pinned and free layers. This variance in resistance can be used to program and read the bit cell 100. The STT-MRAM bit cell 100 also includes a source line 104, a sense amplifier 108, read/write circuitry 106 and a bit line reference 107. Those skilled in the art will appreciate the operation and construction of the memory cell 100 is provided merely as an example.

With reference to FIGS. 2A-C, conventional MTJ storage elements generally are formed by first patterning a bottom fixed layer, forming a single damascene, depositing the tunneling barrier/free layer/top electrode stack, and performing a chemical mechanical polishing (CMP) step. Additional details are provided, for example, in M. Hosomi, et al., A Novel Nonvolatile Memory with Spin Transfer Torque Magnetoresistive Magnetization Switching Spin-RAM, proceedings of IEDM conference (2005), which is incorporated herein by reference in its entirety.

For example, as shown in FIG. 3, conventional MTJ storage elements generally are formed on a bottom electrode 302 such as a Si substrate. One or more seed layers (not shown) may be formed on the bottom electrode 302. An antiferromagnetic (AFM) layer 304 is first formed on the bottom electrode 302, and then a first ferromagnetic layer is formed on top of the AFM layer. The first ferromagnetic layer is "pinned" with a fixed magnetization to form a pinned layer. The pinned layer may include one or more layers, such as a bottom pinned layer 306, a coupling layer 308 typically formed of a non-magnetic metal such as ruthenium, and a top pinned layer 310. A tunneling barrier layer 312 is formed of an insulator such as a metal oxide on top of the pinned layer. A free layer 314 is formed of a second ferromagnetic layer directly on top of the tunneling barrier 312. A top electrode or hardmask layer 316 (e.g., tantalum) is formed on top of the free layer 314.

Next, the MTJ stack 300 is subjected to a magnetic annealing process in a vacuum. A pattern is then applied to the MTJ stack using a lithography technique. A photoresist (not shown in FIG. 3) is formed on top of the hardmask layer 316. The patterned cell size may be larger than the final size. Each of the aforementioned layers can be comprised of one or more layers or films.

Next, the MTJ stack 300 is etched using an etching process such as reactive ion etching. The etching process includes trimming the size of the photoresist, patterning the hardmask 316, removing the photoresist, etching the free layer 314, etching the barrier layer 312, etching the pinned layers 306, 308 and 310, and etching the pinning layer AFM 304. Next, a passivation layer is deposited to protect the MTJ storage element and the interlayer dielectric (ILD) insulator layer 318. A combination stack may be needed, along with a low deposition temperature to protect the MTJ and promote adhesion between the MTJ and ILD. Finally, planarization and metallization is performed.

The MTJ stack 300 is susceptible to damage during the etching process due to redeposition of etching byproducts. The step involving removal of photoresist may include processes such as oxygen ashing. Oxygen ashing can cause damage to the hardmask layer 316 during the photoresist removal process. Oxygen ashing can also cause damage to upper portions 320 of sidewalls of the free layer 314. As described above, the etching process proceeds from etching the hardmask layer 316 at the top of the MTJ stack 300 towards etching the pinned layers at the bottom of the stack. As the etching process progresses deeper down the MTJ stack, damage can be caused to sidewalls 322 of the free layer 314. As the etching process proceeds further down the stack, the upper portions 324 and lower portions 326 of the sidewalls of the barrier layer 312 may also be impacted.

As some of the etching byproducts may be conductive, damages to the sidewalls of the MTJ due to redeposition of such etching byproducts may lead to leakage paths, thereby reducing the magnetic resistance (MR) ratio of the MTJ. Such process related damages may result in significantly lower yields. There is a need for techniques which protect the MTJs from damages caused during the fabrication process.

SUMMARY

Exemplary embodiments of the invention are directed to methods for forming MTJ storage devices and devices formed therefrom. The MTJ storage elements can be included in Spin Transfer Torque Magnetoresistive Random Access Memory (STT-MRAM) cells and various other electrical devices.

For example, an exemplary embodiment can include a method of forming a magnetic tunnel junction (MTJ) storage element having a free layer, a barrier layer and a pinned layer, the method comprising: forming an adjusting layer on the free layer; forming a top electrode on the adjusting layer; patterning and etching the top electrode; etching the adjusting layer and the free layer utilizing the top electrode as a mask; encapsulating the adjusting layer, the free layer, and at least a portion of the top electrode with a spacer layer; etching the barrier layer and pinned layer of the MTJ; and depositing a protective covering layer over the spacer layer, barrier layer and pinned layer.

Another embodiment can include a magnetic tunnel junction (MTJ) storage element comprising: an MTJ stack including a free layer, a barrier layer and pinned layer; an adjusting layer formed on the free layer; a top electrode formed on the adjusting layer; a spacer layer, encapsulating at least a portion of the top electrode, the adjusting layer and the free layer; and a protective covering layer formed on the spacer layer, and the MTJ stack.

Another embodiment can include a method of forming a magnetic tunnel junction (MTJ) storage element having a free layer, a barrier layer and a pinned layer, the method comprising: step for forming an adjusting layer on the free layer; step for forming a top electrode on the adjusting layer; step for patterning and etching the top electrode; step for etching the adjusting layer and the free layer utilizing the top electrode as a mask; step for encapsulating the adjusting layer, the free layer, and at least a portion of the top electrode with a spacer layer; step for etching the barrier layer and pinned layer of the MTJ; and step for depositing a protective covering layer over the spacer layer, barrier layer and pinned layer.

Another embodiment a magnetic tunnel junction (MTJ) storage element comprising: an MTJ stack comprising a first magnetic means for holding a first polarization, a first insulating means for enabling a flow of tunneling current, and a second magnetic means for holding a second polarization, wherein the second polarization is reversible; first protective means for protecting a sidewall portion and an upper portion of the second magnetic means from process related damage, the first protective means being disposed along the sidewall portion and upper portion of the second magnetic means; and second protective means for protecting the first magnetic means, and the first insulating means from process related damage, the second protective means being in contact with the first magnetic means and the first insulating means.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
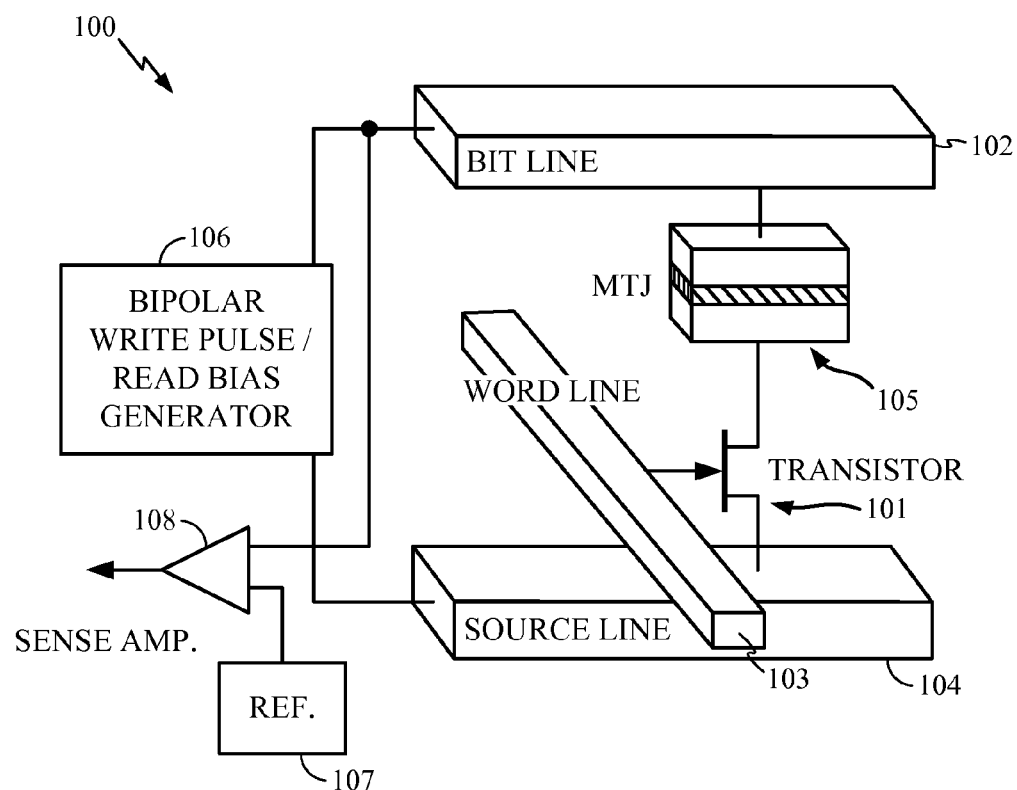
FIG. 1 illustrates a conventional Spin Transfer Torque Magnetoresistive Random Access Memory (STT-MRAM) cell array.
Figure 2:
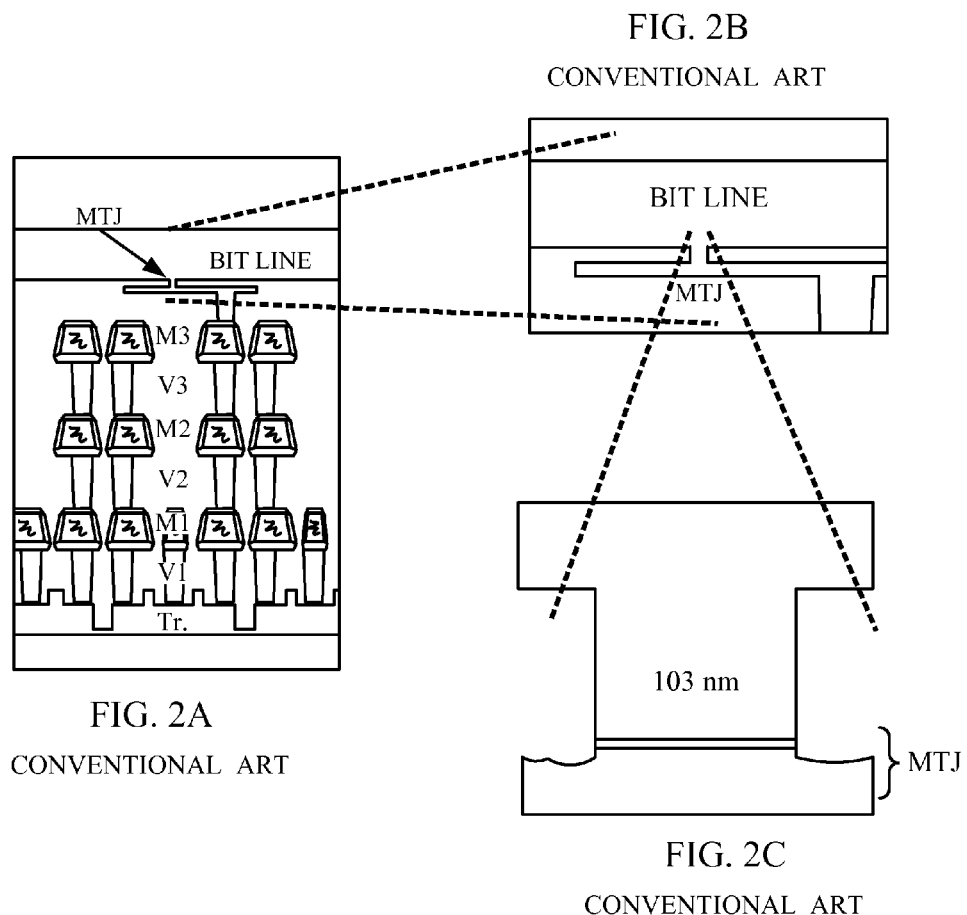
FIG. 2A is a cross-sectional view of a conventional STT-MRAM cell.
FIG. 2B is an enlargement of a portion of the conventional STT-MRAIVI cell according to FIG. 2A.
FIG. 2C is an enlargement of the conventional MTJ cell according to FIG. 2A.
Figure 3:
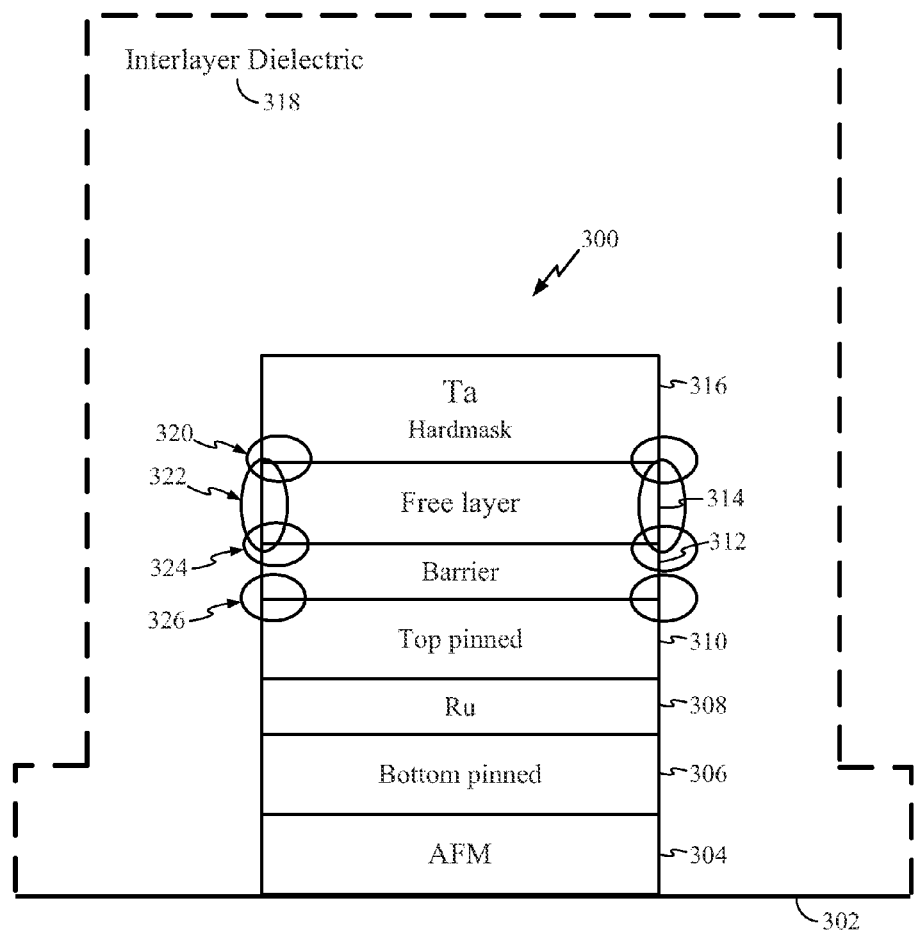
FIG. 3 is a schematic cross-sectional view of a conventional MTJ stack, illustrating portions of the MTJ stack susceptible to process related damage.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. The terminology used herein is for the purpose of describing particular embodiments only and is not intended to be limiting of embodiments of the invention.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The disclosed embodiments recognize that, with conventional methods, it may be difficult to protect from process related damages, the hardmask layer 316, sidewalls of the MTJ stack 300, and in particular, the upper portions 320 and sidewalls 322 of the free layer 314, and the upper and lower portions 324 and 326 respectively of the tunneling barrier 312. Existing techniques do not provide an effective solution for protecting MTJs from at least all the process related damages described above. For example, Assefa et al., "Utilizing Sidewall Spacer Features to Form Magnetic Tunnel Junctions in an Integrated Circuit", United States Patent Application Publication, Pub. No. US 2008/0211055 A1 (2008), at least fails to provide an effective remedy to potential damages illustrated in FIG. 4.

Figure 4:
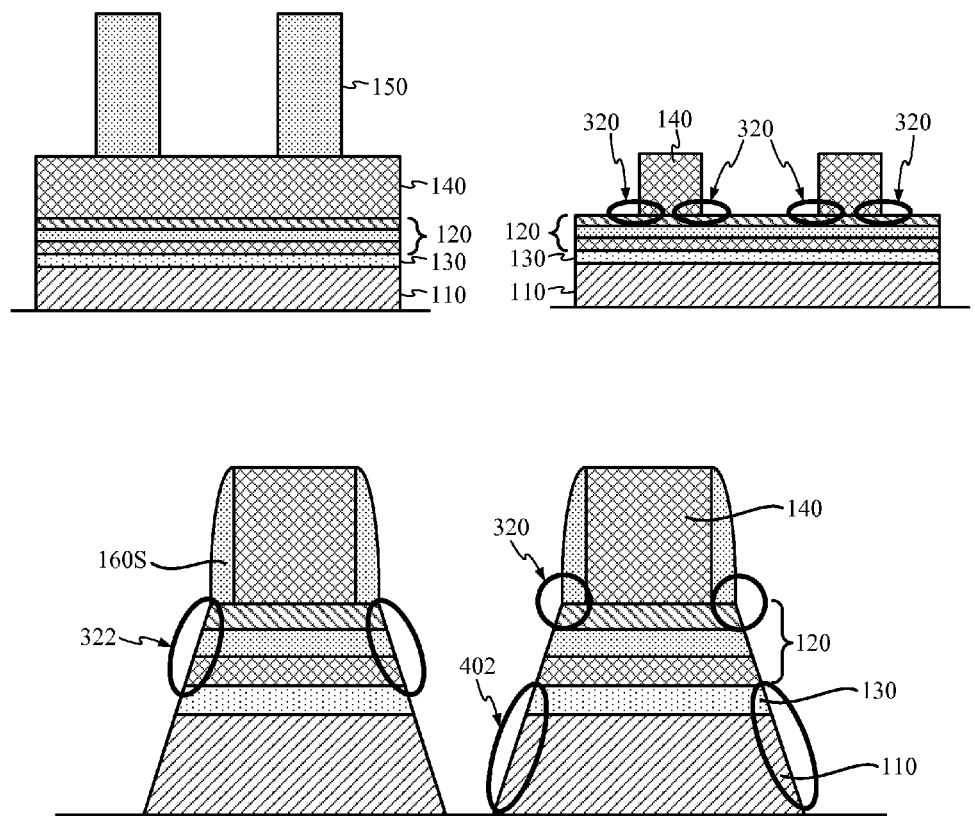
FIG. 4 illustrates conventional techniques for protecting the MTJ stack from process related damage

As shown in FIG. 4, the prior art technique upper portions 320 of the free layer 120 are exposed to damage during the processes of removal of the photoresist 150 and etching of the hardmask 140. The sidewall spacer 160S described in Assefa et al. creates a tapered masking feature which purportedly helps to avoid damage due to byproduct redeposition on the hardmask layer 140 during the etching process. However, as shown in FIG. 4, the sidewall spacer formation is not enough to protect the upper portions 320 of the free layer 120 from damage. Further, Assefa et al. does not provide any solution for protecting sidewalls 322 of the free layer 120 and sidewalls 402 of the barrier 130, and pinned layers 110 from damage during etching of the MTJ stack.

The exemplary embodiments discussed herein, beneficially allow the MTJ stack to be protected from at least the process related damages described above, thereby generating high yield in the fabrication of MTJs. For example, an adjusting layer is introduced between the free layer 314 and hardmask layer 316 to protect the free layer from damage due to oxygen ashing during photoresist removal. Also, according to the embodiments, one or more spacer layers are formed to protect sidewalls of the free layer 314 during the etching process of the tunneling barrier 312 and the pinned layer stack. Further, according to the embodiments, a covering layer is formed to repair the MTJ after the etching process and protect the patterned (etched) MTJ from natural oxidation.

Additionally, according to the embodiments, the tunneling barrier of the MTJ is not exposed to an ash and clean process. Moreover, in comparison to conventional techniques, the embodiments provide a pinned layer of larger planar area (the area along a plane, in a top-view of the MTJ stack), which reduces the stray field impact of the pinned layer on the free layer 314.

Figure 5:
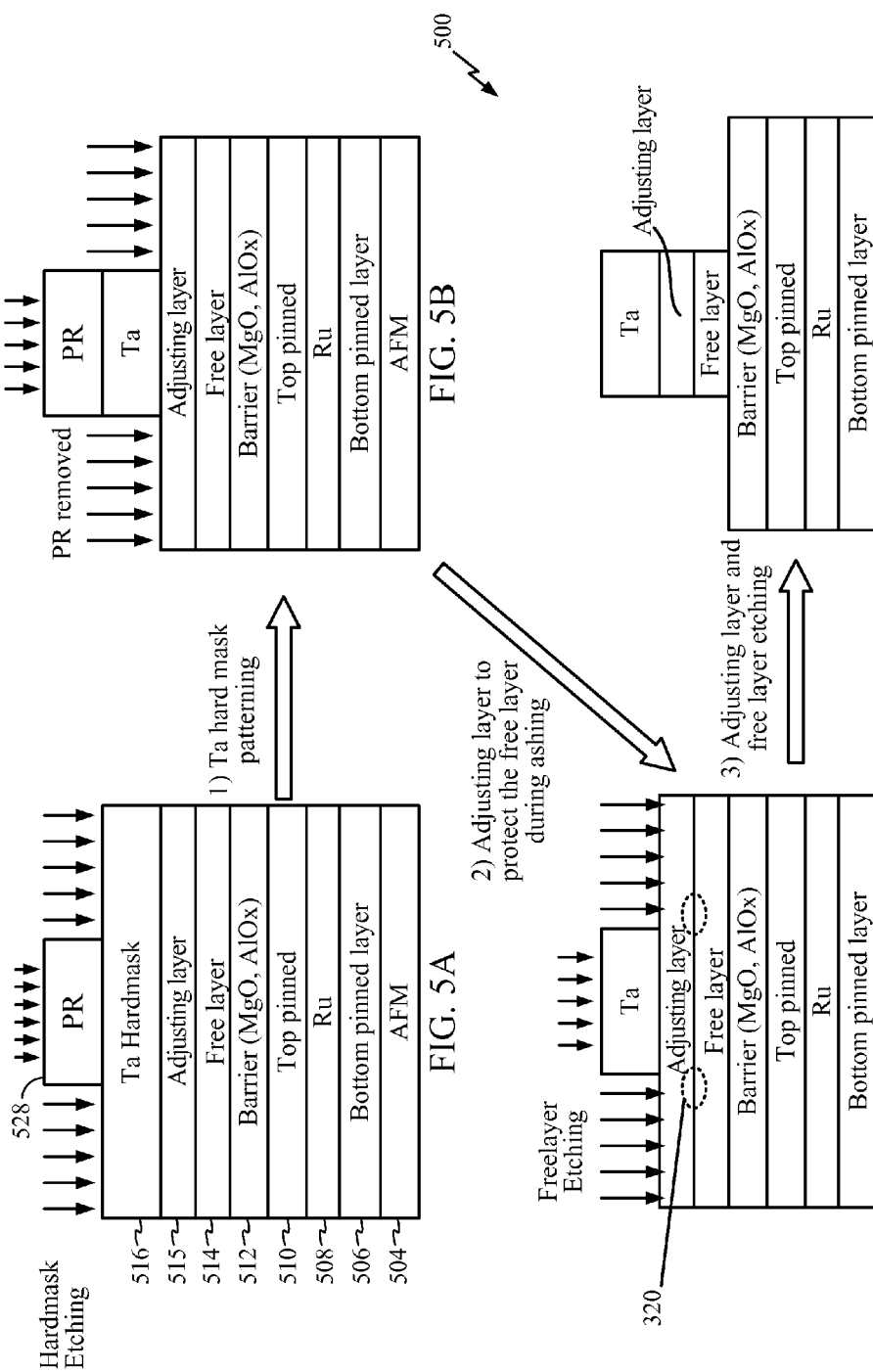
FIGS. 5A-D are schematic cross-sectional views of an exemplary MTJ stack during initial stages of manufacture.
Figure 6:
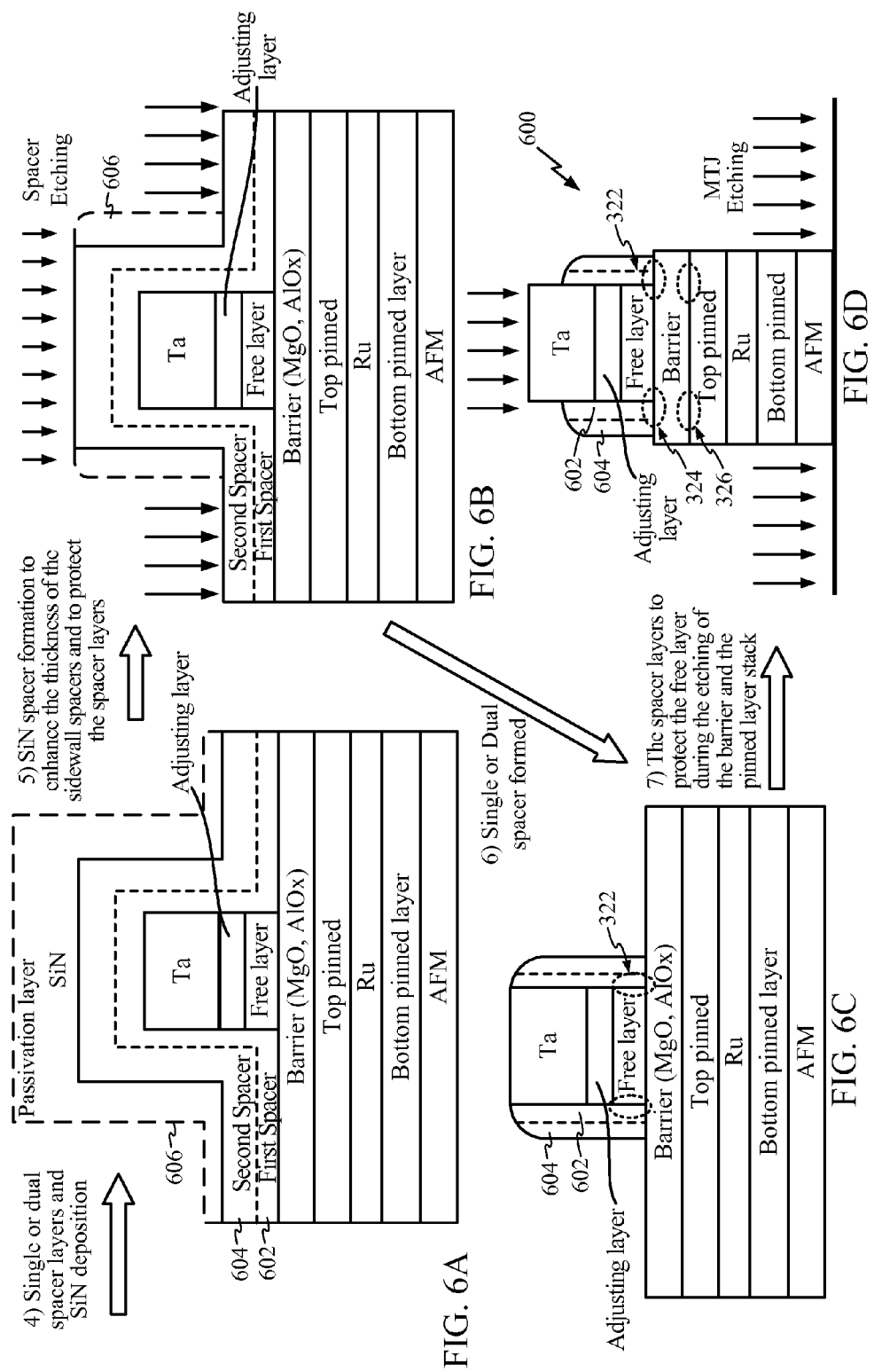
FIGS. 6A-D are schematic cross-sectional views of an exemplary MTJ stack during intermediate stages of manufacture.
Figure 7:
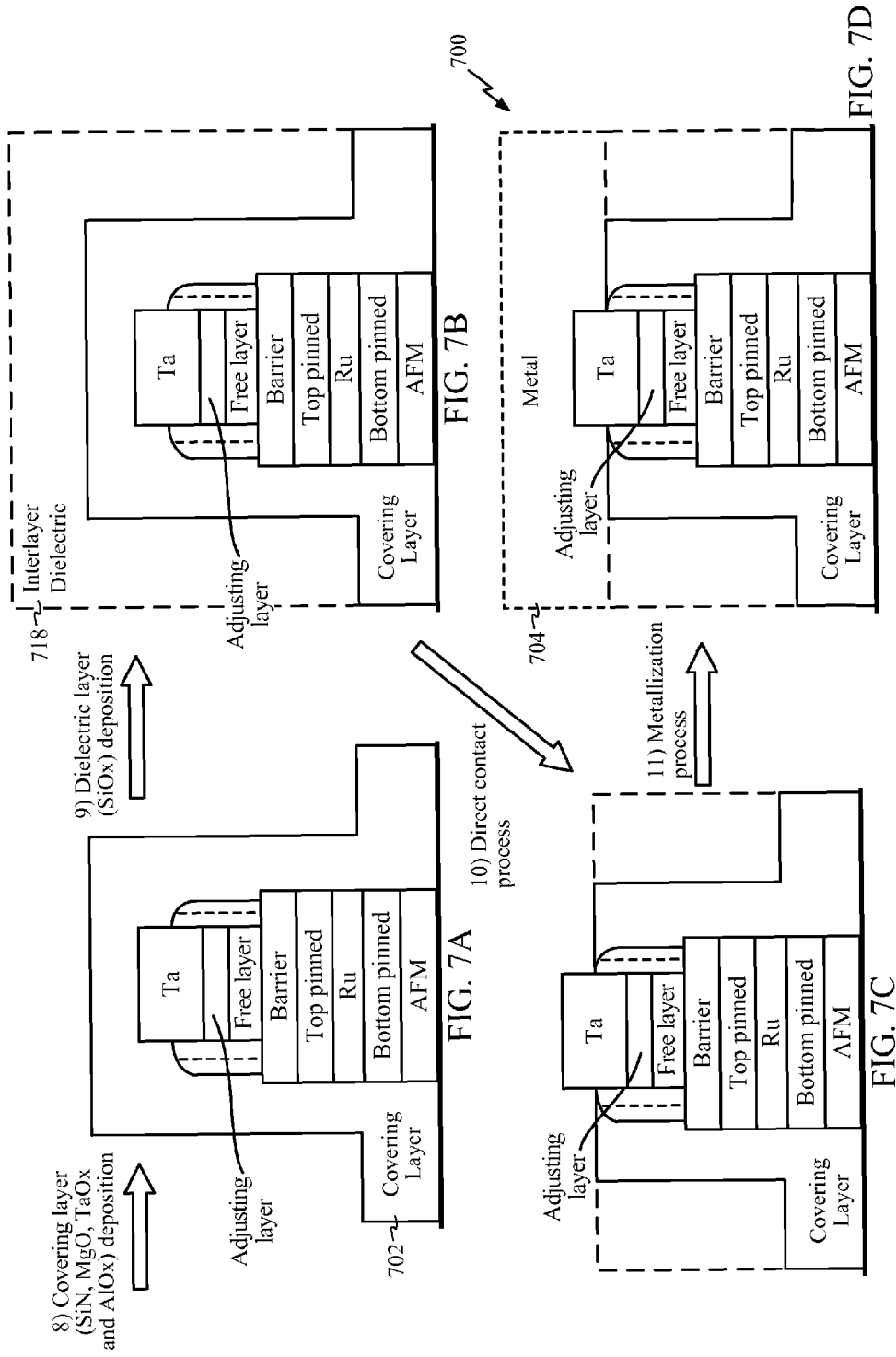
FIGS. 7A-D are schematic cross-sectional views of an exemplary MTJ stack during final stages of manufacture.

With reference to FIGS. 5-7, exemplary embodiments of a method of efficiently fabricating MTJs that reduce process related damages will now be described.

FIGS. 5A-D shows a schematic view of a Magnetic Tunnel Junction formed with an adjusting layer 515 interspersed between the free layer 514 and the hardmask layer (top electrode) 516 according to an exemplary embodiment. The adjusting layer 515 is formed after the step of forming the free layer 514, and before the step of forming the hardmask layer 516 in the fabrication process of the MTJ as described previously, herein. The beneficial roles of the adjusting layer 515 include, protecting the free layer 514 from oxygen ashing during the photoresist 528 removal process, and from redeposition of etching byproducts during etching of the hardmask layer 516. The adjusting layer 515 may preferably be formed from materials with a high oxidation potential such that they may easily form an oxide upon interaction with oxygen. Examples of materials that may be used to form the adjusting layer 515 include AlOx, MgO, Al, Mg, Si, Pt, Ti, Tb, Gd, Zr, Ir, Cr, Cu, Mn, Mo, Ta, Hf and Ru.

As shown in FIGS. 5A-D a protective adjusting layer 515 is formed on top of free layer 514. The photoresist layer 528 and hardmask layer 516 are then patterned using an etching process as shown in FIG. 5A. The etching process may include chemicals such as CF4, fluorine-base gases or chlorine-base gases. The next step includes removal of the photoresist layer 528 using a process such as oxygen ashing as shown in FIG. 5B. The adjusting layer 515 protects the free layer 514 from damage during the process steps of patterning and oxygen ashing as described above. The adjusting layer 515 and the free layer 514 are then patterned, as shown in FIG. 5C. The patterning process may include the use of chemicals such as $CH_3OH$, $CO/NH_3$ or chlorine-base gases. FIG. 5D illustrates an MTJ stack 500 which has undergone the processing steps as described above and illustrated in FIGS. 5A-C. It will be appreciated that the various layers of the MTJ stack are provided merely for illustration and not for limitation. Additional layers may be added and/or layers may be removed or combined and may comprise different materials then illustrated.

Next, as shown in FIG. 6A, one or more spacer layers 602, 604 and a passivation layer 606 are formed on MTJ stack 500. According to an exemplary embodiment which includes two spacer layers formed on top of the MTJ stack 500, the two spacer layers 602 and 604 may be formed from either the same material or different materials. Embodiments which include a single spacer layer (for example 602), and dual spacer layers (for example 602 and 604) will be discussed further in the following sections of this disclosure. A passivation layer 606 is formed on top of the spacer layers 602, 604. The passivation layer 606 may be formed from a material such as SiN, and may provide the benefits of enhancing the thickness of the sidewalls of the spacer layers 602 and 604, and also protect the spacer layers 602 and 604 during process steps such as etching. Initially, it should be noted that in an exemplary embodiment illustrated in FIG. 6, spacer layers 602, 604 and the passivation layer 606 form a protective layer around the hardmask layer 516 and the free layer 514. Prior art spacer 160S illustrated in FIG. 4 does not provide a protective layer for sidewalls 322 of the free layer 514.

Next, the embodiment of FIG. 6A is subjected to etching using a process such as $CF_4$ etching, etching with a fluorine-base gas or etching with a chlorine-base gas. Initially, the spacer layers 602, 604 and the passivation layer 606 protect the sidewalls of the hardmask layer 516, the adjusting layer 515 and the free layer 514 during this process, as illustrated in FIG. 6B. Upon further patterning of the passivation layer 606 and the spacer layers 602 and 604, using a process such as $CF_4$ etching, spacer layers 602 and 604 remain as protective layers around sidewalls of the hardmask layer 516, the adjusting layer 515 and the free layer 514 as shown in FIG. 6C. The barrier layer 512, the pinned layer stack and the antiferromagnetic layer 504 are then patterned using an etching process such as $CH_3OH$ etching, $CO/NH_3$ etching or etching with a chlorine-base gas to form MTJ stack 600 as shown in FIG. 6D. One of ordinary skill in the art will appreciate that the free layer 514 is protected from process related damage during the process steps described above.

Because the spacer layers 602 and 604 remain as protective layers around the sidewalls of the free layer 514 during the etching process described above, the planar areas of the tunneling barrier 512, the pinned layer stack and the AFM layer 504, post etching, may be larger than the planar areas of at least the free layer 514 as illustrated in FIG. 6D. Accordingly, one of ordinary skill in the art will appreciate that the upper and lower portions 324 and 326 of the barrier layer 512 are protected from damage, and not impacted by the $CH_3OH$ etching process. While other arrangements are possible, the illustrated embodiments of FIG. 6D may provide additional advantages, such as improved magnetic stability. Further, the larger the planar area of the pinned layers, the smaller the impact of stray fields on free layer 514. The planar area of the free layer 514 controls the effective resistance characteristics of the MTJ stack 600. Hence, process related damages, if any, to the sidewalls of the tunneling barrier 512 and the pinned layer stack (which are of a larger planar area), do not significantly impact the proper functioning of the MTJ stack 600.

An exemplary embodiment, as mentioned above, may include two spacer layers 602 and 604 formed from different materials. The "inner" spacer layer 602, may be formed from a metal, which may either be magnetic or non-magnetic. A spacer layer 602 thus formed from a metallic material may advantageously serve the function of repairing sidewalls 322 of free layer 514 post etching. The "outer" spacer layer 604 may be formed from an insulator, and may advantageously serve the function of protecting the sidewalls 322 of the free layer 514 during the etching processes. Such a "dual" spacer structure including a metallic inner spacer layer 602 and an insulator outer spacer layer 504 may further improve the switching uniformity and enhance thermal stability of the MTJ.

The inner spacer layer 602 of a dual spacer embodiment may be formed from magnetic metals such as CoFeB, CoFe, NiFe, Co, Fe, Ni, TbFe, TbCo, TbCoFe, GdFe, GdCo, FePt, CoPt and CoCrPt; and non-magnetic metals such as Al, Mg, Si, Pt, Ti, Tb, Gd, Zr, Ir, Cr, Cu, Mn, Mo, Ta, Hf and Ru. The outer spacer layer 604 of the dual spacer embodiment may include insulator materials such as SiNx, SiOx, SiON, AlOx, MgO, TaOx and TiOx.

Yet another exemplary embodiment may include a single spacer layer (for example 602) or multiple spacer layers formed from the same material. A method including a single spacer layer includes at least the improvement over prior art in that the spacer layer extends to and fully covers sidewalls 322 of the free layer 514, while the conventional spacer layer (for example 160S in FIG. 4) does not protect the sidewalls 322 of the free layer 514. A single spacer layer as described above may be formed from the same material as the adjusting layer 515.

The process can continue, as shown in FIG. 7A, and includes depositing a covering layer over MTJ stack 600. The covering layer is similar to the passivation layer 606 and may be formed of materials such as SiN, SiON, MgO, TaOx and AlOx. The function of the covering layer is to provide a protective and repairing cover around the etched MTJ stack 600. An ILD layer 718 is deposited on top of the covering layer 702 as shown in FIG. 7B. The next step includes planarizing and etching back the ILD layer 518 and the covering layer 702 to enable the top electrode or hardmask layer 516 to be connected to a metallic layer, as shown in FIG. 7C. Metallization is performed next, wherein, a metal layer 704 is deposited on top of the MTJ stack, such that the metal layer 704 is in contact with the top electrode or hard mask layer 516. The MTJ stack 700 derived as a result of the process steps above is illustrated in FIG. 7D.

According to the exemplary method, an MTJ storage element can be fabricated, free from or with reduced process related damages which are common to conventional methods of MTJ fabrication. As explained above, the exemplary embodiments beneficially protect the upper portions 320 of sidewalls and the sidewalls 322 of the free layer 514 and the upper and lower portions 324 and 326 of the barrier layer 512 from damage during etching processes. In general, the exemplary embodiments protect the MTJ stack 700 from process related damage during fabrication.

Additionally, according to the embodiments, the planar area of the barrier layer 512, the pinned layer stack and the bottom electrode or AFM layer 504 are larger than the planar area of the free layer 514, which provides for improved magnetic stability and decreased impact by stray fields on the operation of the MTJ.

Figure 8:
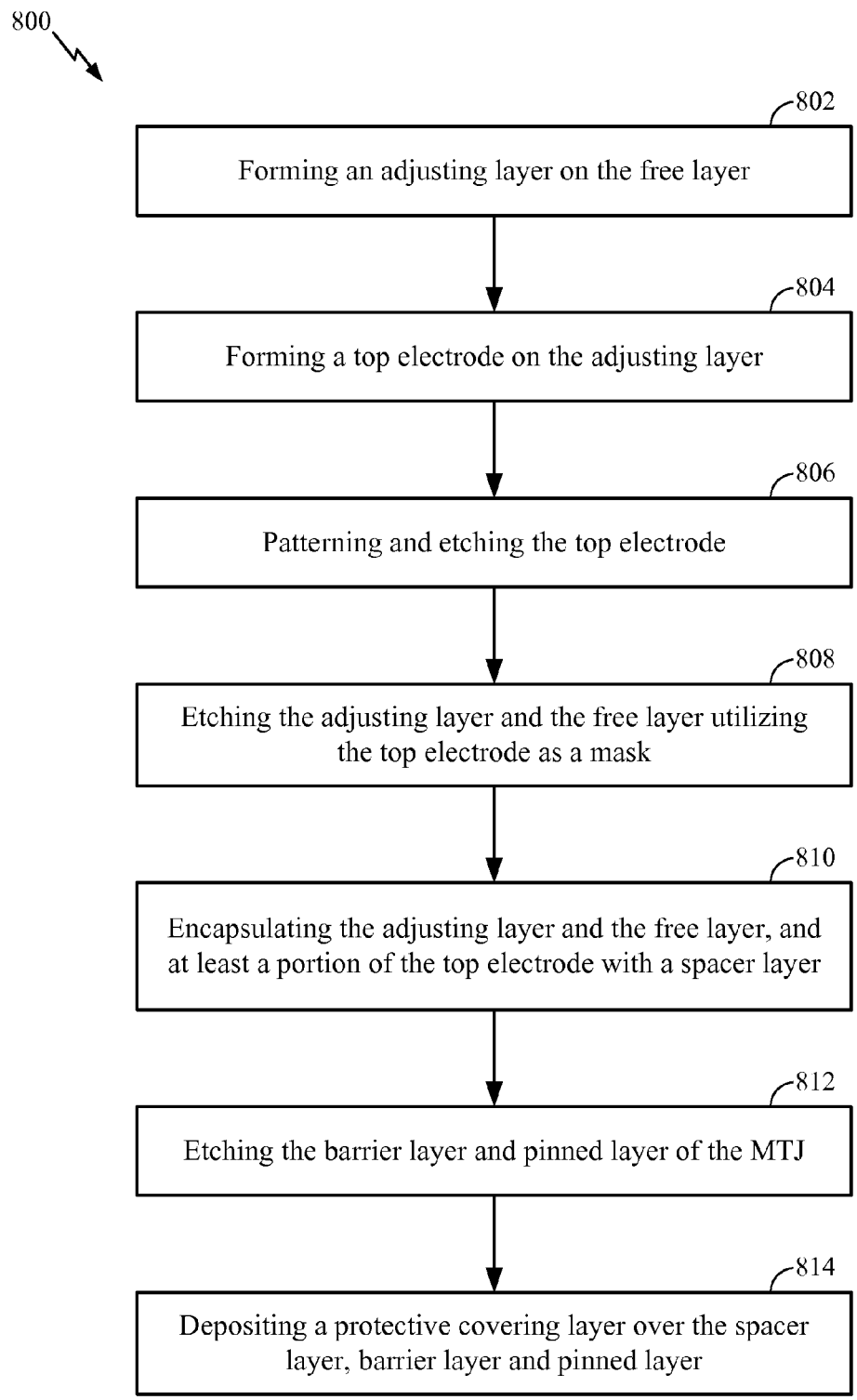
FIG. 8 is a flowchart illustrating exemplary methods.

It will be appreciated that embodiments include various methods for performing the processes, functions and/or algorithms disclosed herein. For example, as illustrated in FIG. 8, an embodiment can include a method of forming a magnetic tunnel junction (MTJ) storage element having a free layer, a barrier layer and a pinned layer. The method can include forming an adjusting layer on the free layer, block 802, to protect the free layer as discussed above. A top electrode can be formed on the adjusting layer, block 804. The top electrode can be patterned and etched, block 806. The adjusting layer and the free layer can be etched be utilizing the top electrode as a mask, block 808. The adjusting layer and the free layer and at least a portion of the top electrode can be encapsulated with a spacer layer, block 810. The barrier layer and pinned layer of the MTJ can be etched, block 812. Then, a protective covering layer can be deposited over the spacer layer (already covering the adjusting layer and free layer), barrier layer and pinned layer (and any remaining layers of the MTJ stack), block 814.

It will be appreciated that memory devices including the MTJ storage elements described herein may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including memory having MTJ storage elements as disclosed herein.

Further, it will be appreciated that various to memory devices can include an array of MTJ storage elements as disclosed herein. Additionally, the MTJ storage elements disclosed herein may be used in various other applications, such as in logic circuits. Accordingly, although potions of the foregoing disclosure discuss the stand alone MTJ storage element, it will be appreciated that various embodiments can include devices into which the MTJ storage element is integrated.

The foregoing disclosed devices and methods can be designed and can be configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Accordingly, embodiments can include machine-readable media or computer-readable media embodying instructions which when executed by a processor transform the processor and any other cooperating elements into a machine for performing the functionalities described herein as provided for by the instructions.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A magnetic tunnel junction (MTJ) storage element comprising:
   an MTJ stack including a free layer, a barrier layer and pinned layer;
   an adjusting layer formed on the free layer, wherein the adjusting layer is configured to protect the free layer from oxygen ashing and redeposition of etching byproducts;
   a top electrode formed on the adjusting layer;
   a spacer layer, encapsulating at least a portion of the top electrode, the adjusting layer and the free layer, wherein the spacer layer comprises an inner spacer layer formed from a metallic material and an outer spacer layer;
   a passivation layer formed on top of the spacer layer, wherein the passivation layer is configured to enhance a thickness of sidewalls of the spacer layer and protect the spacer layer during etching; and
   a protective convering layer directly formed on sidewalls of the spacer layer, wherein at least a portion of the top electrode is exposed from the spacer layer and the protective covering layer.

2. The MTJ storage element of claim 1, wherein the metallic material is magnetic.

3. The MTJ storage element of claim 1, wherein the metallic material is non-magnetic.

4. The MTJ storage element of claim 1, wherein the outer spacer layer is formed from an insulating material.

5. The MTJ storage element of claim 1, wherein the MTJ stack further includes an antiferromagnetic layer adjacent the pinned layer.

6. The MTJ storage element of claim 1, wherein a planar area of the barrier layer is greater than a planar area of the free layer.

7. The MTJ storage element of claim 1, wherein a planar area of the pinned layer is greater than a planar area of the free layer.

8. The MTJ storage element of claim 1, wherein the pinned layer includes a bottom pinned layer, a coupling layer and a top pinned layer.

9. The MTJ storage element according to claim 1, wherein the MTJ storage element is integrated into an electronic device, selected from the group consisting of a set top box, music player, video player, entertainment unit, navigation device, mobile phone, portable computer, hand-held personal communication system (PCS) units, communications device, personal digital assistant (PDA), fixed location data unit, and a computer.

10. The MTJ storage element according to claim 1, wherein the MTJ storage element is integrated into a memory array comprising a plurality of MTJ storage elements.

11. A magnetic tunnel junction (MTJ) storage element comprising:
an MTJ stack comprising a first magnetic means for holding a first polarization, a first insulating means for enabling a flow of tunneling current, and a second magnetic means for holding a second polarization, wherein the second polarization is reversible;
first protective means for protecting a sidewall portion and an upper portion of the second magnetic means from process related damage, the first protective means being disposed along the sidewall portion and upper portion of the second magnetic means, wherein the first protective means comprises an inner protective means formed from a conductive material and an outer protective means;
passivation means formed on top of the first protective means, wherein the passivation means is configured to enhance a thickness of sidewalls of the first protective means and protect the first protective means during etching;
and
second protective means for protecting the first magnetic means, and the first insulating means from process related damage, the second protective means being in contact with the first magnetic means and the first insulating means, wherein the second protective means is configured to protect the first magnetic means from oxygen ashing and redeposition of etching byproducts, wherein a planar area of the first insulating means is greater than a planar area of the second magnetic means and a planar area of the first magnetic means is greater than a planar area of the second magnetic means, wherein the MTJ storage element is integrated into a memory array comprising a plurality of MTJ storage elements.

12. The MTJ storage element of claim 11, wherein the outer protective means is formed from an insulating material.

13. The MTJ storage element of claim 11, wherein the first magnetic means comprises a bottom magnetic means, a coupling means and a top magnetic means.

14. The MTJ storage element according to claim 11, wherein the MTJ storage element is integrated into an electronic device, selected from the group consisting of a set top box, music player, video player, entertainment unit, navigation device, mobile phone, portable computer, hand-held personal communication system (PCS) units, communications device, personal digital assistant (PDA), fixed location data unit, and a computer.

* * * * *